United States Patent
Roybal et al.

[11] Patent Number: 5,911,583
[45] Date of Patent: Jun. 15, 1999

[54] STACKED ELECTRICAL CIRCUIT HAVING AN IMPROVED INTERCONNECT AND ALIGNMENT SYSTEM

[75] Inventors: Ty J. Roybal; Stephen R. Stegura, both of Tucson; Peter J. Drake, Vail, all of Ariz.

[73] Assignee: Raytheon Company, Lexington, Mass.

[21] Appl. No.: 08/977,404

[22] Filed: Nov. 24, 1997

[51] Int. Cl.$^6$ .................................................... H01R 9/09
[52] U.S. Cl. ............................................. 439/66; 439/70
[58] Field of Search ........................................ 439/66, 70

[56] References Cited

U.S. PATENT DOCUMENTS

| | | | |
|---|---|---|---|
| 4,988,306 | 1/1991 | Hopfer, III et al. | 439/66 |
| 5,324,205 | 6/1994 | Ahmad et al. | 439/66 |
| 5,744,759 | 4/1998 | Ameen et al. | 174/260 |

*Primary Examiner*—Edgar Burr
*Assistant Examiner*—Charles H. Nolan, Jr.
*Attorney, Agent, or Firm*—David W. Collins; Andrew J. Rudd; Glenn H. Lenzen, Jr.

[57] ABSTRACT

A three-dimensional stacked electrical circuit assembly that uses spherical or cylindrical metallic contacts that are surface mounted to input and output pads of circuit substrates that contact recessed wire button contacts disposed in cavities formed in a nonmetallic spacer disposed between the substrates. Each metallic contact fits into a through hole in the spacer and makes contact with a separate wire button contact in the through hole of the spacer. The metallic contacts are recessed within the spacer and are protected from contamination and handling damage. Back-to-back spacers may be employed that use plungers to make contact between wire button contacts disposed therein. The wire button contacts are recessed in the through holes, which provides for an interconnect system having low contact resistance, high current capacity, low contact force, and the ability to customize the shape of the spacer. The present invention aligns stacked circuit assemblies and eliminates the need for through holes, maximizes internal routing area, and reduces cost.

15 Claims, 4 Drawing Sheets

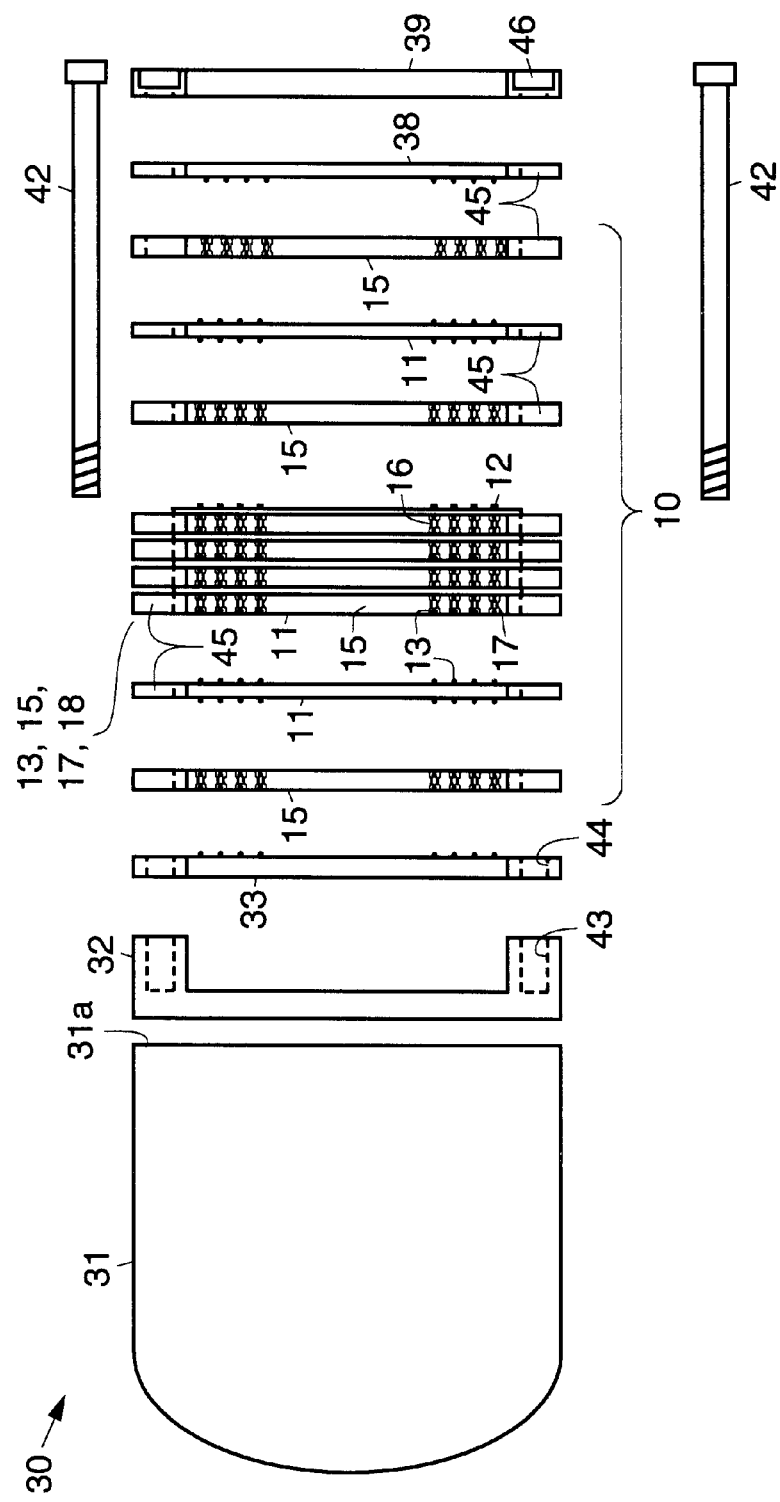

STACKED ELECTRICAL CIRCUIT HAVING AN IMPROVED INTERCONNECT AND ALIGNMENT SYSTEM

BACKGROUND

The present invention relates generally to stacked electrical circuits, and more particularly, to an improved arrangement for aligning and electrically interconnecting stacked electrical circuit boards when using a wire button contact system.

Previously, wire button contact approaches used to interconnect multiple stacked circuit boards were plagued with problems associated with dislodged or contaminated wire button contacts. This is because the wire button contacts protruded from the surface of its spacer/carrier, thus exposing it to damage. Prior techniques for aligning stacked printed wiring boards utilize a pin and through hole design. For example, U. S. Pat. No. 4,922,381 discloses a typical three-dimensional stacked printed wiring board arrangement. The pin and through hole alignment technique requires valuable internal routing area that is particularly wasteful in light of current electronic circuit miniaturization objectives. The pin and through hole alignment technique also requires precisely located through holes which, significantly increases manufacturing costs of the circuit board, which is especially true if the circuit board is made of ceramic.

Thus, it would be advantageous to have an electrical interconnect system for stacked circuit boards which employs wire button interconnects that do not become dislodged or contaminated. It would also be advantageous to have an electrical interconnection system which provides assembly-to-assembly alignment of multiple stacked circuit boards and eliminates the need for alignment through holes, maximizes internal routing area, and reduces cost of the assembled boards Accordingly, it is an objective of the present invention to provide for improved stacked electrical circuit assemblies through a protected wire button contact system. It is a further objective of the present invention to provide for stacked electrical circuit assemblies whose input/output pads are aligned without additional or external alignment apparatus.

SUMMARY OF THE INVENTION

To accomplish the above and other objectives, the present invention provides for a three-dimensional stacked electrical interconnect system using wire button contacts having apparatus for aligning and electrically interconnecting input and output (I/O) pads of multiple stacked circuit assemblies without external alignment apparatus. The heart of this stacked interconnect system are low electrical resistance nonoxidizing, cold flow resistant spheres, such as gold over nickel plated copper spheres, for example, surface mount attached to the I/O pads of each circuit assembly that key with a nonmetallic circuit board to circuit board spacer containing wire button contacts recessed within through holes. Each sphere, on corresponding I/O pads of the circuit boards, fits into opposite sides of a through hole in the spacer and make electrical contact with a wire button contact protected within the spacer. The I/O pad arrangement of the circuit boards to be interconnected must be identical. A nonsymmetrical I/O arrangement acts as a clocking mechanism providing only one mating possibility to insure proper alignment and board stack-up.

The present invention recesses the wire button contacts into the safety of through holes in the circuit board to circuit board spacer, which provides for an interconnect system having low contact resistance, high current capacity, low mating force, and the ability to customize the shape of the spacer. The present invention, when compared to prior art techniques, provides for assembly-to-assembly alignment of stacked circuit assemblies that eliminates the need for through holes in the circuit board, maximizes internal routing area, and reduces cost.

The use of a noble metal over metal spheres, such as gold over copper spheres, surface-mount attached to the circuit board using solder, or preferably solder paste, has the advantage that they self-center on the preferably circular substrate pad during reflow. This self-centering feature allows low cost, low precision, tooling to be used when placing the spheres on the substrate.

Since the wire button contact is recessed within the spacer it is protected from contamination and handling damage, which is of particular importance in high density three-dimensional interconnect applications. This arrangement also provides for assembly-to-assembly alignment without reducing internal routing area of the board or requiring through holes.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 5 illustrates an exploded partial cross-sectional view of a three-dimensional stacked interconnect circuit assembly of the present invention employed in a missile;

DETAILED DESCRIPTION

Figure 1:
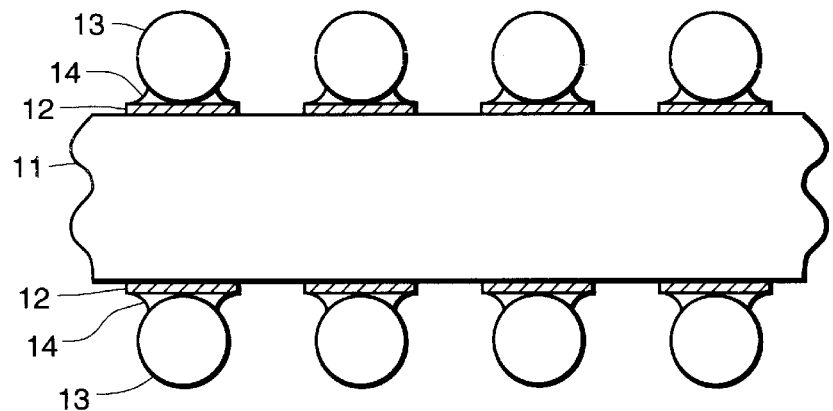
FIG. 1 illustrates a plurality of contacts in accordance with the principles of the present invention comprising metal spheres attached to the I/O pads of a substrate.

Referring to the drawing figures, FIG. 1 illustrates a first portion of a three-dimensional stacked interconnect circuit assembly 10 in accordance with the present invention which is a substrate 11 having a plurality of input/output (I/O) pads 12 and a plurality of spherical (preferred) or cylindrical metal contacts 13 attached to the plurality of I/O pads 12. The spherical or cylindrical metal contacts 13 are preferably low electrical resistance, nonoxidizing, cold flow resistant entities, such as the preferred plated gold over plated nickel, over a core of copper (most preferred) or brass (preferred) for example. There is no particular limitation as to the surface metallization or the core material, in that the core may be nonmetallic, for example, as long as the above contact properties are provided. The metal contacts 13 are surface mount attached to the I/O pads 12, such as by using an electrically conductive adhesive system 14 or preferably reflowed solder 14, for example. The I/O pads 12 are preferably circular with a diameter equal to the diameter of the contact 13, and preferred range of ±5% of the diameter of the contact 13. The contacts 13 are shown surface mount attached to the I/O pads 12 on both sides of the substrate 11. However, it is to be understood that the metal contacts 13 may be surface mount attached to the I/O pads 12 on only one surface of the substrate 11 (such as is shown in FIG. 3).

Figure 2:
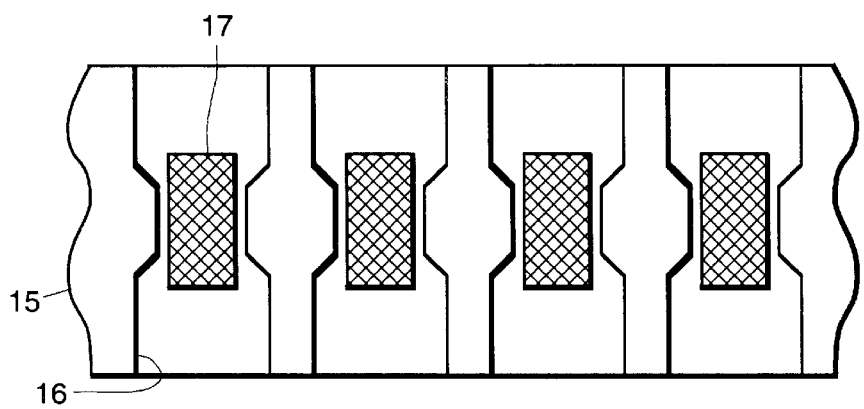
FIG. 2 illustrates a nonmetallic spacer containing wire button contacts in accordance with the principles of the present invention that are recessed within through holes.

FIG. 2 shows a second portion of the three-dimensional stacked interconnect circuit assembly 10 comprising a nonmetallic spacer 15 containing recessed wire button contacts 17 in accordance with the present invention. The wire button contacts 17 are available from connector manufacturers, such as Cinch Connector Division and Technic, for example. The nonmetallic spacer 15 may be made of a material such as plastic polymer, for example, or other suitable nonmetallic material. There are no particular limitations regarding the material from which the nonmetallic spacer 15 is made.

The nonmetallic spacer 15 comprises a plurality of through holes 16 that have a smaller diameter or cross-section adjacent the center of the spacer 15 adjoining the cavities 16. The wire button contacts 17 are disposed in the through holes 16 and are recessed below the respective surfaces of the nonmetallic spacer 15. The wire buttons are inserted into the smaller diameter or cross-sectional portion of the spacer 15 so that they protrude a predetermined amount into the larger diameter of the through holes 16. The larger diameter is at least that of the contact 13, and preferably 10% to 20% larger than the diameter of the I/O pad 12.

Figure 3:
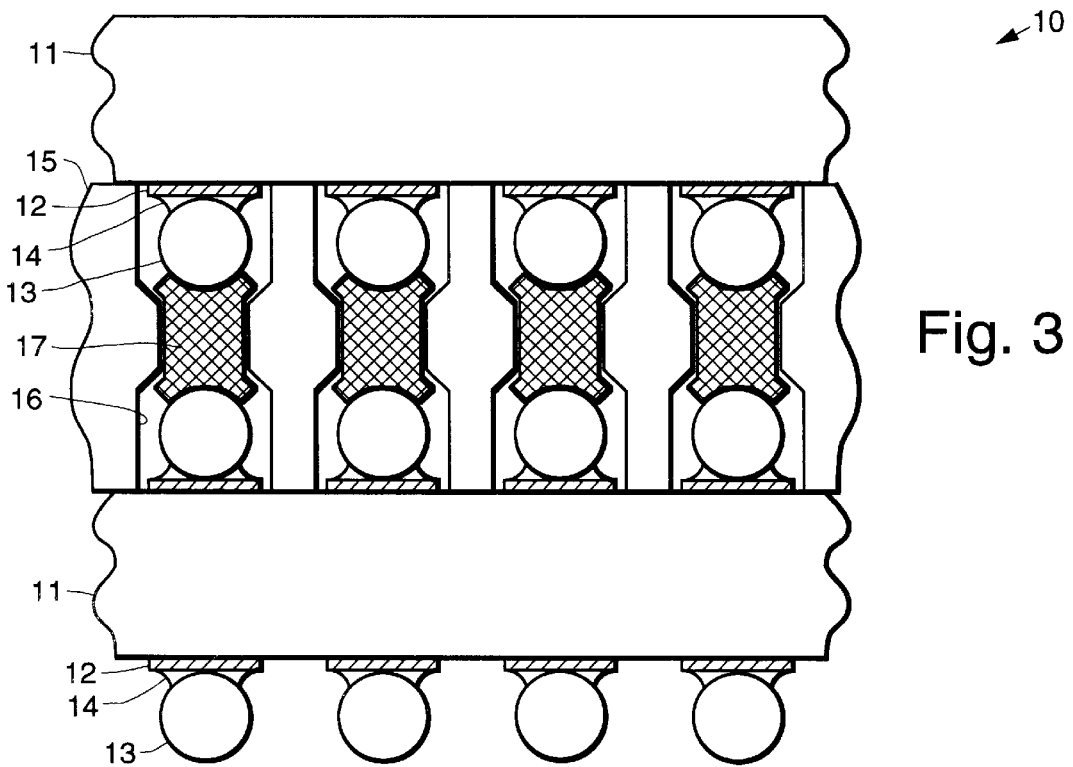
FIG. 3 illustrates a three-dimensional stacked interconnect circuit assembly in accordance with the present invention that uses the contacts, spacer and recessed wire button contacts shown in FIGS. 1 and 2.

FIG. 3 illustrates the three-dimensional stacked interconnect circuit assembly 10 that employs the metal contacts 13, spacer 15 and recessed wire button contacts 17 shown in FIGS. 1 and 2. The exemplary three-dimensional stacked interconnect circuit assembly 10 shown in FIG. 3 comprises three subassemblies. The first subassembly is a first substrate 11 having metal spheres surface mount attached to the I/O pads 12 on one surface thereof. The second subassembly is a nonmetallic spacer 15 containing recessed wire button contacts 17. The third subassembly is a second substrate 11 withmetal spheres surface mount attached to the I/O pads 12 on both surfaces thereof.

The exemplary three-dimensional circuit assembly 10 shown in FIG. 3 is formed by inserting the metal spheres of the first substrate 11 into the through holes 16 of the nonmetallic spacer 15 so that the metal spheres contact the wire button contacts 17 disposed in the nonmetallic spacer 15. The metal spheres of the second substrate 11 are inserted into the through holes 16 on the opposite side of the nonmetallic spacer 15 so that the metal spheres contact the wire button contacts 17 disposed in the nonmetallic spacer 15. Insertion of the respective pluralities of metal spheres into opposite sides of the through holes 16 compresses the respective wire button contacts 17 as is illustrated in FIG. 3. This makes electrical contact between the metal spheres of the first and second substrates 11. Further three-dimensional stacking may be obtained by using additional nonmetallic spacers 15 and substrates 11 having metal spheres surface mount attached to the I/O pads 12 on both surfaces thereof.

The stacked three-dimensional circuit assembly 10 may be completed with either a spacer 15 or substrate 11, depending upon how the stacked circuit assembly 10 is to electrically and mechanically interface with its surroundings. A clamping system is 10 used to apply pressure to the stacked assembly 10 so that contact is maintained between all wire button contacts 17 and metal contacts 13. There are no limitations regarding the technique used to apply clamping pressure to the stacked assembly 10.

When the three-dimensional stack is mated together a sphere fills each side of the spacer through hole 16, compressing the protected wire button contact 13, and forming a low mating force, multi-contact, electrical interconnect. In addition, the surface mount sphere-into-spacer design aligns the assemblies (substrates 11 and spacers 15) without area intensive through-the-board alignment mechanisms. Thus, the present invention provides advantages in three areas: it protects the wire button contacts 13 from damage and contamination, it aligns the circuit boards, and it maximizes internal board area available for circuit routing.

The present invention was developed for a multiplicity of uses, such as in missiles, for example, such as those manufactured by the assignee of the present invention, high density transmit/receive radar module, and a communication module having over 5000 sphere interconnects on an aluminum nitride substrate. The present invention achieves packaging densities and cost savings compared to previous designs.

As mentioned in the Background section, prior art alignment techniques, such as is disclosed in U. S. Pat. No. 4,922,381, for example, uses through holes for assembly to-assembly alignment. In accordance with the teachings of this patent, electrical interconnection is provided by elastomeric connectors completely separate from the alignment. The present invention combines the tasks of alignment and electrical interconnect into a space saving, surface mountable, structure.

The use of pin-in-through hole alignment used in the prior art reduces the available circuit routing area of each layer within the substrate 11. In addition, the expense of forming holes (such as in ceramic) limits material selection options. In contrast, the ball-to-button alignment and electrical interconnect approach of the present invention has no effect on internal circuit routing area, or material comprising the substrate 11. The metal contacts 13 are surface-mount attached to the substrate 11. Surface mount assembly requires no internal routing area and may be used with any substrate material. Combining the alignment and electrical interconnect tasks frees space on the substrate 11 or printed wiring board thus providing previously unavailable assembly miniaturization possibilities.

Figure 4:
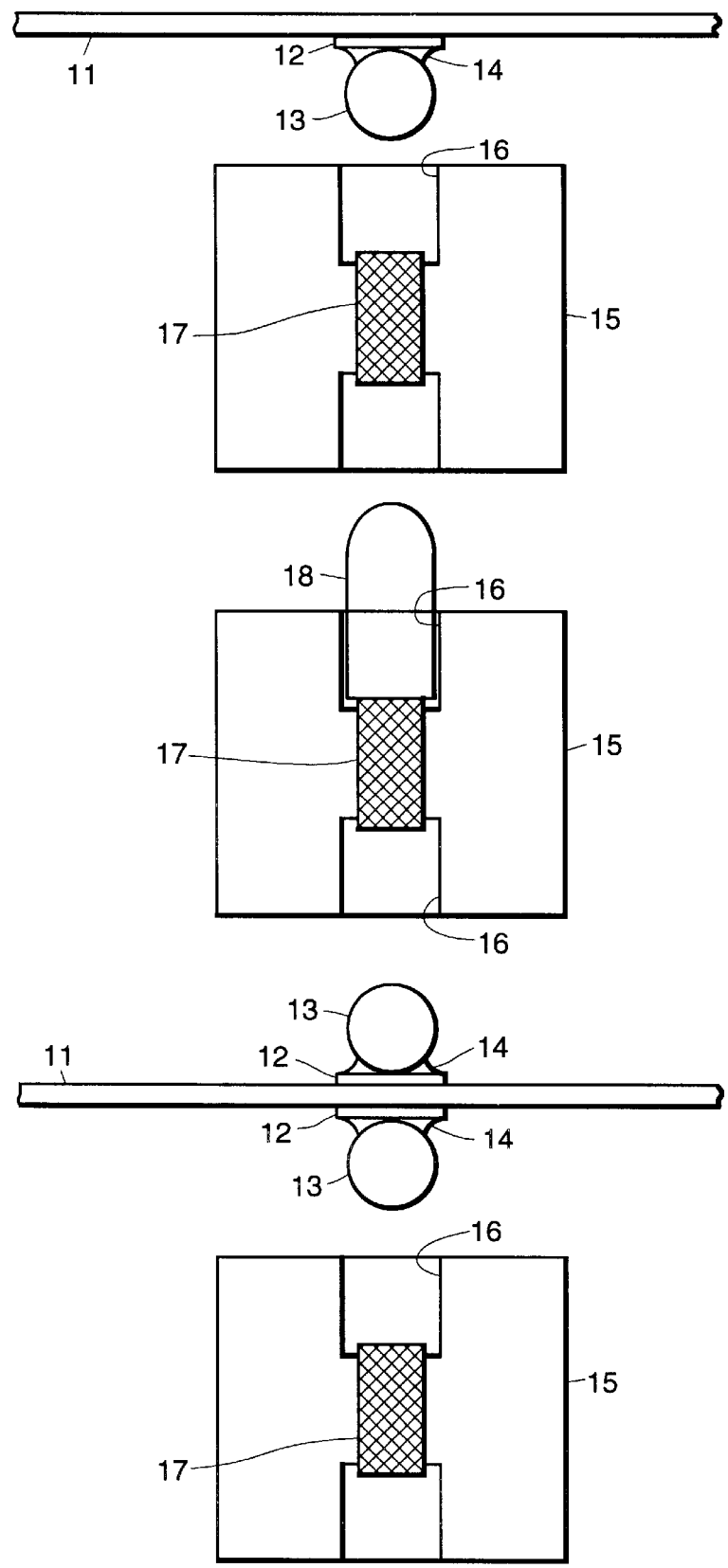
FIG. 4 shows an stacked interconnect assembly in accordance with the principles of the present invention having plungers disposed in adjacent nonmetallic spacers that make contact with recessed wire button contacts, which are used when the thickness of a spacer exceeds the span of a single wire button contact.

FIG. 4 shows an exemplary stacked circuit assembly 10 that employs plungers 18 disposed in adjacent nonmetallic spacers 15 that make contact with recessed wire button contacts 17 disposed in the cavities 16 of the adjacent nonmetallic spacers 15. In the embodiment of the stacked circuit assembly 10 shown in FIG. 4, two spacers 15 are disposed adjacent to one another, that each contain recessed wire button contacts 17. A plunger is disposed in one of the adjacent cavities 16 that extends beyond the surface of the spacer 15. The plunger inserts into the cavity 16 of the adjacent spacer 15 and metal contacts 13 the recessed wire button contact 17 disposed therein. Thus, it may be seen that combinations of substrates 11 and spacers 15 may be stacked to form any desired circuit arrangement using the principles of the present invention to make contact between the various circuit layers.

The present invention thus provides a means of aligning and electrically interconnecting the I/O pads 12 of stacked circuit subassemblies without external alignment structures. The key to the alignment/interconnect system are spherical or cylindrical metallic contacts 13 on the I/O pads 12 of each circuit subassembly. These contacts 13 mate with corresponding through holes 16 (or detents) in the assembly-to-assembly spacer 15. This design allows the wire button contacts 17 (electrical interconnects) within the spacer 15 to be recessed below the mating surface of the spacer 15 providing handling protection for the wire button contacts 17 prior to assembly. The present invention provides an easily verified means for aligning and stacking multiple circuit board assemblies. Improper alignment will not allow the spacer 15 to sit flush on the surface of a circuit board.

Figure 7:
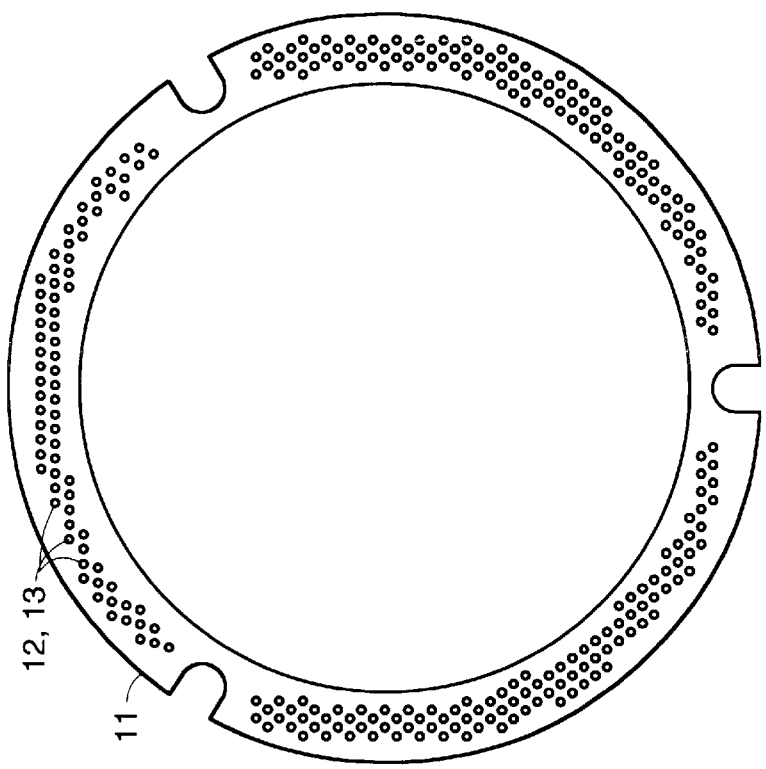
FIG. 7 shows a spacer used in the present invention.
Figure 6:
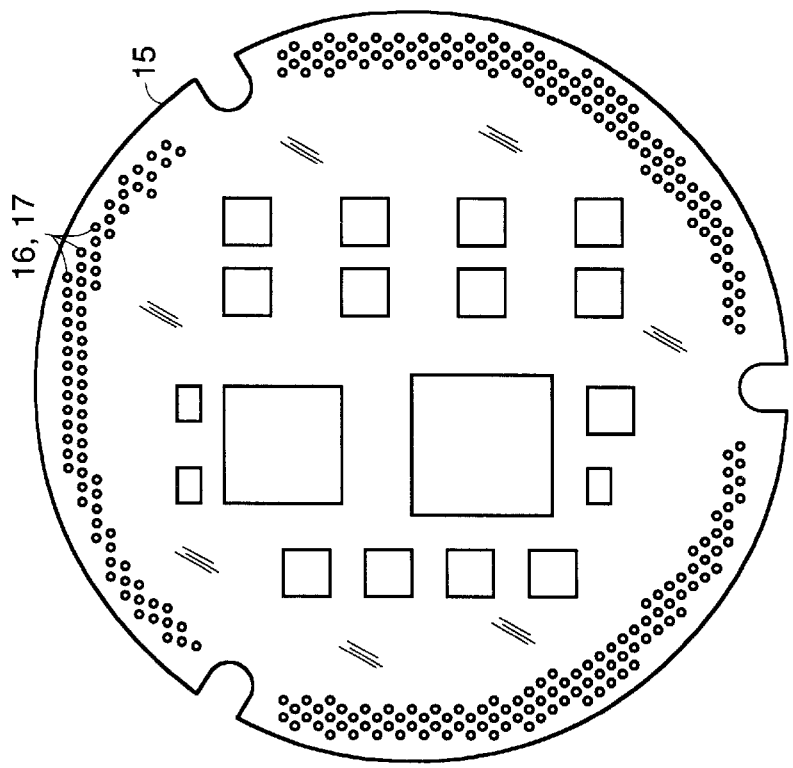
FIG. 6 illustrates a forward end substrate used in the missile shown in FIG. 5.

The present invention may be advantageously employed in cylindrical structures such as a missile 30, for example. FIG. 5 illustrates an exploded partial cross-sectional view of a portion of a missile 30, with its fuselage removed, in which a three-dimensional stacked interconnect circuit assembly 10 of the present invention is employed. The missile 30 comprises a seeker assembly 31 disposed at its front end, a bulkhead adapter 32 that mates with an aft end 31a of the seeker assembly 31, and a forward interface 33 disposed adjacent to the aft end of the bulkhead adapter 32. A forward end substrate 11 (FIG. 6) of the stacked interconnect assembly 10 having a plurality of I/O pads 12 and metal contacts such as in the manner shown in FIG. 1 is coupled to the forward interface 33 through a spacer 15 (FIG. 7). The forward end substrate 11 is shown having a plurality of circuit components thereon (not numerically identified). The forward interface 33 is also a substrate 11 but has been identified differently because it provides the electrical connection between the seeker assembly 31 and the three-dimensional stacked interconnect circuit assembly 10. The ball-to-button alignment and electrical interconnect approach of the present invention is of particular value when the connection between the forward interface 33 and the three-dimensional stacked interconnect circuit assembly 10 must be made blind, such as when the connection is made bay inserting the three-dimensional stacked interconnect circuit assembly 10 into the open end of a closed container, such as into a missile fuselage section attached to the aft end of the seeker assembly 31.

A stacked interconnect circuit assembly 10 comprising a plurality of stacked substrates 11 and nonmetallic spacers 15 such as is shown in FIG. 3, for example, is shown partially exploded between the forward interface 33 and the aft interface 38. The aft interface 38 like the forward interface 33 is a substrate 11 which has been identified differently because it provides the electrical connection between the three-dimensional stacked interconnect circuit assembly 10 and the aft end of the missile 30. The three-dimensional stacked interconnect circuit assembly 10 includes spherical or cylindrical contacts 13 that mate with recessed wire button contacts 17 disposed in the nonmetallic spacers 15 of the stacked interconnect circuit assembly 10, as has been described with reference to FIGS. 1–3, for example. Although not shown in FIG. 5, the plungers 18 shown in FIG. 4 may also be employed in the three-dimensional stacked interconnect circuit assembly 10, depending upon the circuit design. The forward interface 33, stacked interconnect circuit assembly 10, and aft interface 38 are compressed between the forward bulkhead adapter 32 and an aft compression ring 39. A plurality of machine screws 42 (three each) are used to compress the electronics stack. Heads of the machine screws 42 sit I recesses of the aft compression ring 39, and the threaded ends of the machine screws 42 are threaded into holes 43 in the bulkhead adapter 32. However, it is to be understood that the machine screws 42 illustrate one possible arrangement for applying a compressive force to the electronics stack comprising the forward interface 33, three-dimensional stacked interconnect circuit assembly 10, and the aft interface 38.

Thus, three-dimensional stacked interconnect electrical circuit assemblies have been disclosed along with the use of such assemblies in a missile. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A stacked interconnect electrical circuit assembly comprising:

a first substrate comprising a plurality of input/output pads and a plurality of electrical contacts surface mount attached to the plurality of input/output pads;

a second substrate comprising a plurality of input/output pads and a plurality of electrical contacts surface mount attached to the plurality of input/output pads; and a nonmetallic spacer comprising a plurality of through holes that have a smaller cross-section adjacent the center of the spacer, and a plurality of recessed wire button contacts captured by the smaller cross-section that are recessed below the respective surfaces of the spacer and that protrude a predetermined amount into each through hole;

and wherein the respective pluralities of contacts of the first and second substrates are disposed in the through holes on opposite sides of the spacer and contact and compress the respective recessed wire button contacts captured in the through holes so as to make electrical contact between the first and second substrates, and that aligns the first and second substrates.

2. The circuit assembly of claim 1 wherein each electrical contact comprises a spherical electrical contact.

3. The circuit assembly of claim 1 wherein each electrical contact comprises a cylindrical electrical contact.

4. The circuit assembly of claim 2 wherein the spherical electrical contact comprises a gold plated brass sphere.

5. The circuit assembly of claim 2 wherein the spherical electrical contact comprises a gold plated copper sphere.

6. The circuit assembly of claim 3 wherein the cylindrical electrical contact comprises a gold plated brass cylinder.

7. The circuit assembly of claim 3 wherein the cylindrical electrical contact comprises a gold plated copper cylinder.

8. The circuit assembly of claim 1 wherein the electrical contacts comprise a low resistance, nonoxidizing,,cold flow resistant member having a metallic core material.

9. The circuit assembly of claim 1 wherein the electrical contacts comprise a low resistance, nonoxidizing, cold flow resistant member having a nonmetallic core material.

10. The circuit assembly 10 of claim 1 wherein the nonmetallic spacer comprises ceramic material.

11. The circuit assembly of claim 1 wherein the electrical contacts are attached to the input/output pads by solder.

12. The circuit assembly of claim I wherein the wire button contacts are recessed below surfaces of the spacer such that they are protected from handling and contamination.

13. The circuit assembly of claim 12 wherein the wire button contacts are recessed cold flow resistant contacts.

14. The circuit assembly of claim 1 wherein the electrical contacts comprise surface mount attached, self-centering spheres.

15. The apparatus of claim 1 further comprising:

a second nonmetallic spacer comprising a plurality of cavities disposed adjacent to first and second surfaces of the spacer that have a smaller cross-section adjacent the center of the spacer adjoining the cavities, and a plurality of recessed wire button contacts disposed in the cavities that are recessed below the respective surfaces of the spacer and that protrude a predetermined amount into each cavity, and wherein the second nonmetallic spacer is disposed adjacent to the nonmetallic spacer; and a plurality of plungers disposed in cavities of the second nonmetallic spacer that are adjacent to the nonmetallic spacer that contact the recessed wire button contacts disposed therein and extend beyond the surface of the spacer, and wherein the plungers insert into the cavities of the adjacent spacer and contact the recessed wire button contacts disposed therein.

\* \* \* \* \*